(12) United States Patent
Jung et al.

(10) Patent No.: US 8,669,581 B2
(45) Date of Patent: Mar. 11, 2014

(54) LIGHT EMITTING DEVICE PACKAGE INCLUDING UV LIGHT EMITTING DIODE

(75) Inventors: Jung Su Jung, Seoul (KR); Byung Mok Kim, Seoul (KR); Yu Dong Kim, Seoul (KR); Gun Kyo Lee, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 13/350,258

(22) Filed: Jan. 13, 2012

(65) Prior Publication Data

US 2012/0267671 A1    Oct. 25, 2012

(30) Foreign Application Priority Data

Apr. 20, 2011    (KR) .......................... 10-2011-0036931

(51) Int. Cl.
*H01L 33/00*    (2010.01)

(52) U.S. Cl.
USPC .................. 257/99; 257/98; 257/81; 257/79; 257/677; 257/690; 438/106; 438/26; 438/34; 438/65

(58) Field of Classification Search
USPC ............... 257/99, 98, 81, 100, 132, 432, 434, 257/668, 677, 690, 79; 438/106, 26, 34, 65
See application file for complete search history.

(56) References Cited

U.S. PATENT DOCUMENTS

| 5,567,972 | A | * | 10/1996 | Abe ............................... 257/433 |
| 6,441,392 | B1 |  | 8/2002 | Gautier et al. |
| 6,881,980 | B1 |  | 4/2005 | Ting |
| 2004/0208210 | A1 |  | 10/2004 | Inoguchi |
| 2009/0101897 | A1 |  | 4/2009 | Murphy et al. |
| 2010/0258838 | A1 | * | 10/2010 | Chiang et al. ................... 257/99 |
| 2010/0290233 | A1 |  | 11/2010 | Okazaki |
| 2012/0026720 | A1 | * | 2/2012 | Cho ............................... 362/84 |

FOREIGN PATENT DOCUMENTS

KR    10-0980588 B1    8/2010
WO   WO 2007/074983 A1    7/2007

OTHER PUBLICATIONS

European Search Report dated Oct. 4, 2013.

* cited by examiner

*Primary Examiner* — Telly Green
(74) *Attorney, Agent, or Firm* — Ked & Associates, LLP

(57) ABSTRACT

Provided is a light emitting device package, which includes a ceramic body, an ultraviolet light emitting diode, a support member, and a glass film. The ceramic body defines a cavity. The ultraviolet light emitting diode is disposed within the cavity. The support member is disposed on the body, and surrounds the cavity. The glass film is coupled to the support member, and covers the cavity. Since the light emitting device package includes the ceramic body to efficiently dissipate heat, and the glass film is directly attached to the ceramic body to decrease the number of components, thereby simplifying the manufacturing process thereof, and reducing the manufacturing costs thereof.

19 Claims, 6 Drawing Sheets

LIGHT EMITTING DEVICE PACKAGE INCLUDING UV LIGHT EMITTING DIODE

CROSS-REFERENCE TO RELATED APPLICATIONS

The present application claims priority under 35 U.S.C. 119 and 35 U.S.C. 365 to Korean Patent Application No. 10-2011-0036931 (filed on Apr. 20, 2011), which is hereby incorporated by reference in its entirety.

BACKGROUND

The present disclosure relates to a light emitting device package including an ultraviolet light emitting diode.

Light emitting diodes (LEDs) may constitute light emitting sources by using compound semiconductor materials such as GaAs-based materials, AlGaAs-based materials, GaN-based materials, InGaN-based materials, and InGaAlP-based materials.

Such light emitting diodes are packaged as a light emitting device package that emits beams of various colors. Light emitting device packages are used as light sources in various fields for displaying colors, e.g., lighting displays, character displays, and image displays.

Particularly, ultraviolet (UV) LEDs emit rays of a wavelength ranging from about 245 nm to 405 nm. Of these, rays of a short wavelength have sterilizing and purifying functions, and rays of a long wavelength may be used in an exposure apparatuses or a curing apparatus.

However, UV LEDs generate a large amount of heat while emitting light, which causes a defect and degrades operation reliability. In addition, when a package size of UV LEDs is increased to improve heat dissipation efficiency, integration efficiency and economic efficiency are jeopardized.

SUMMARY

Embodiments provide a light emitting device package having an improved structure.

Embodiments provide an ultraviolet light emitting device package that has appropriate heat dissipation efficiency and is compatible with various devices, regardless of wavelengths.

In one embodiment, a light emitting device package includes a ceramic body, an ultraviolet light emitting diode, a support member, and a glass film. The ceramic body defines a cavity. The ultraviolet light emitting diode is disposed within the cavity. The support member is disposed on the body, and surrounds the cavity. The glass film is coupled to the support member, and covers the cavity.

The details of one or more embodiments are set forth in the accompanying drawings and the description below. Other features will be apparent from the description and drawings, and from the claims.

DETAILED DESCRIPTION OF THE EMBODIMENTS

Figure 1:
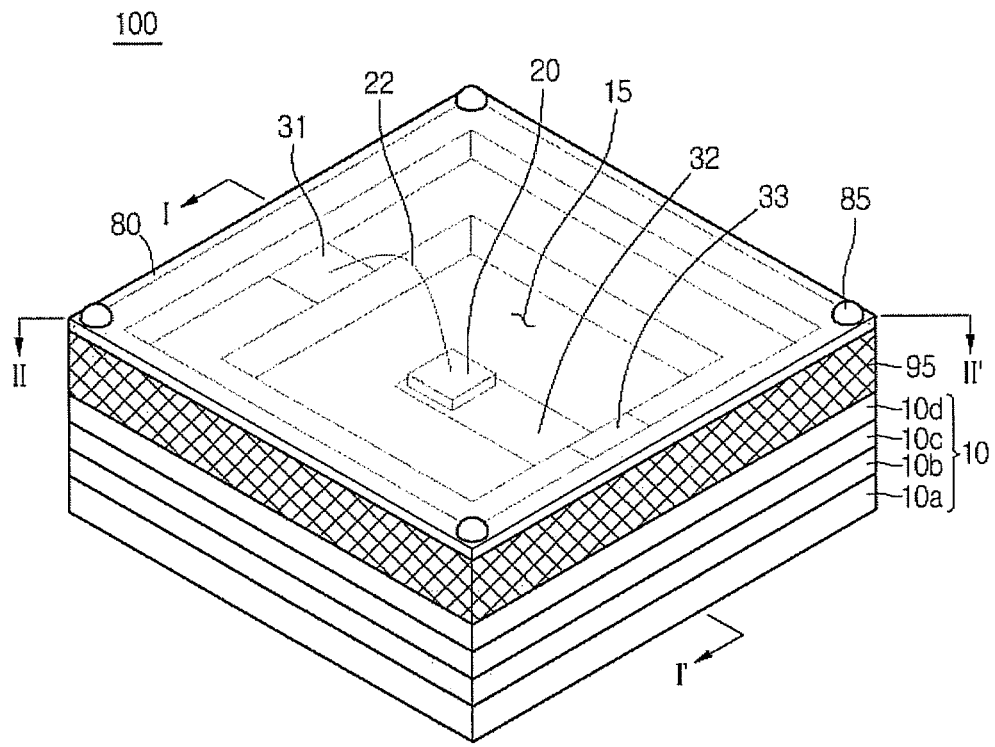
FIG. 1 is a perspective view illustrating a light emitting device package according to a first embodiment.

Hereinafter, preferred embodiments of the present invention will be described in detail with reference to the accompanying drawings in such a manner that the technical idea of the present invention may easily be carried out by a person with ordinary skill in the art to which the invention pertains. The present disclosure may, however, be embodied in different forms and should not be construed as limited to the embodiments set forth herein.

In this specification, when it is described that one comprises (or includes or has) some elements, it should be understood that it may comprise (or include or has) only those elements, or it may comprise (or include or have) other elements as well as those elements if there is no specific limitation.

In the drawings, anything unnecessary for describing the present disclosure will be omitted for clarity, and thicknesses are enlarged for the purpose of clearly illustrating layers and areas. Like reference numerals in the drawings denote like elements, and thus their descriptions will be omitted.

In the specification, it will be understood that when a layer, a film, a region, or a plate is referred to as being 'on' another layer, film, region, or plate, it can be directly on the other layer, region, or plate, or intervening layers, films, regions, or plates may also be present. On the other hand, it will also be understood that when a layer, a film, an area or a plate is referred to as being "directly on" another one, intervening layers, films, areas, and plates may not be present.

Hereinafter, a light emitting device package according to a first embodiment will now be described with reference to FIGS. 1 to 5.

Figure 2:
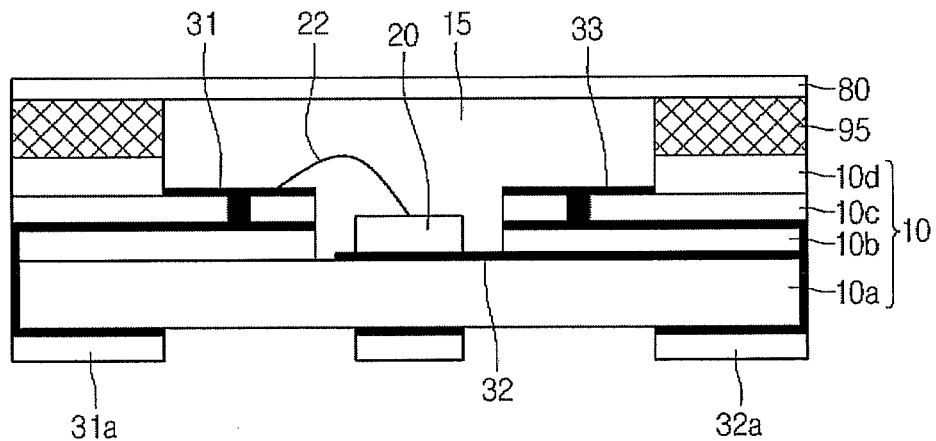
FIG. 2 is a cross-sectional view taken along line I-I' of FIG. 1.
Figure 3:
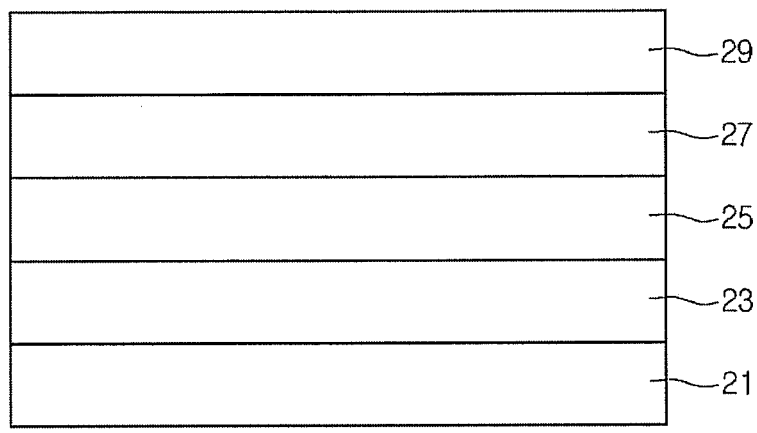
FIG. 3 is a cross-sectional view illustrating a light emitting diode of FIG. 1.
Figure 4:
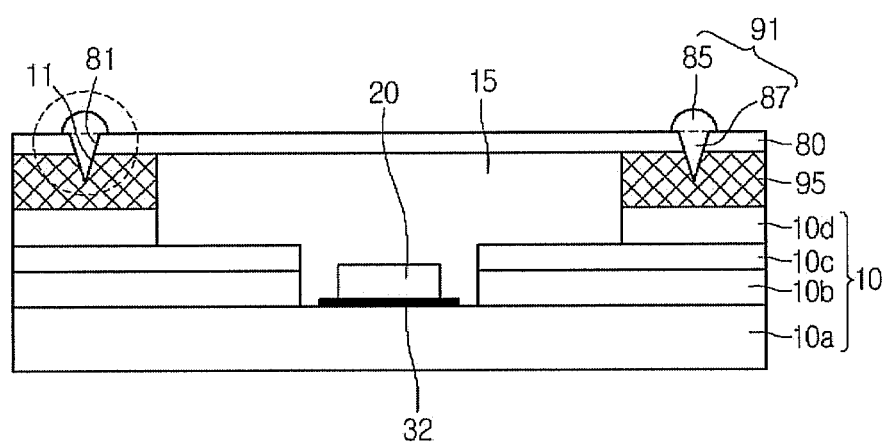
FIG. 4 is a cross-sectional view taken along line II-II' of FIG. 1.

FIG. 1 is a perspective view illustrating a light emitting device package according to the first embodiment. FIG. 2 is a cross-sectional view taken along line I-I' of FIG. 1. FIG. 3 is a cross-sectional view illustrating a light emitting diode of FIG. 1. FIG. 4 is a cross-sectional view taken along line II-II' of FIG. 1. FIGS. 5A and 5B are perspective views illustrating examples of a portion defined by a dotted circle of FIG. 4.

Referring to FIGS. 1 to 3, a light emitting device package 100 includes: a body 10; at least one light emitting diode 20 disposed on the body 10; and first and second electrodes 31 and 32 disposed on the body 10, and electrically connected to the light emitting diode 20.

Further, the light emitting device package 100 includes a light transmitting film 80 protecting the light emitting diode 20, and a support member 95 supporting the light transmitting film 80.

The body 10 is formed by stacking insulating layers 10a, 10b, 10c, and 10d, which are formed of ceramic materials. The body 10 may be formed of a low temperature co-fired ceramic (LTCC) or high temperature co-fired ceramic (HTCC), which is obtained by co-firing the insulating layers 10a, 10b, 10c, and 10d between which a metal pattern may be disposed.

The insulating layers 10a, 10b, 10c, and 10d of the body 10 may be formed of a nitride or oxide, and the nitride improves heat conductivity.

The insulating layers 10a, 10b, 10c, and 10d may be formed of SiO$_2$, Si$_x$O$_y$, Si$_3$N$_4$, Si$_x$N$_y$, SiO$_x$N$_y$, Al$_2$O$_3$, or AlN, preferably, be formed of AlN.

An upper opening of the body 10 may be formed by a cavity 15.

The cavity 15 may be defined by the insulating layers 10a, 10b, 10c, and 10d. As illustrated in FIGS. 2 and 4, the first insulating layer 10a is a base insulating layer having no pattern, and the second and third insulating layers 10b and 10c have a central opening in which the light emitting diode 20 is mounted. The fourth insulating layer 10d disposed on the third insulating layer 10c has an opening greater than that of the third insulating layer 10c, so as to form the cavity 15.

However, the shape of the cavity 15 for mounting the light emitting diode 20 is not limited thereto, and thus, may be varied according to a design of the insulating layers 10a, 10b, 10c, and 10d.

The cavity 15 may have a cup or concave container shape, and be formed through punching between the insulating layers 10a, 10b, 10c, and 10d, and thus, have a side surface perpendicular to a bottom surface.

The cavity 15 may have a circular, tetragonal, polygonal, or oval shape from a plan view.

The first and second electrodes 31 and 32 may be disposed between the insulating layers 10a, 10b, 10c, and 10d. The first electrode 31 and the second electrode 32 are electrically separated from each other as positive and negative electrodes in order to supply power to the light emitting diode 20. Other electrodes than the first electrode 31 and the second electrode 32 may be provided according to a design of the light emitting diode 20, but the present disclosure is not limited thereto.

The first electrode 31 and the second electrode 32 may have a multi layered structure. For example, the first electrode 31 and the second electrode 32 may be a Ti/Cu/Ni/Au layer formed by sequentially stacking titanium (Ti), copper (Cu), nickel (Ni), and gold (Au).

That is, the lowermost layer of the first electrode 31 and the second electrode 32 is formed of a material efficiently adhered to the insulating layers 10a, 10b, 10c, and 10d, such as titanium (Ti), chrome (Cr), and tantalum (Ta); the uppermost layer of the first electrode 31 and the second electrode 32 is formed of a material having excellent electric conductivity, such as gold (Au) to which a wire is efficiently attached; and a diffusion barrier layer formed of platinum (Pt), nickel (Ni), or copper (Cu) may be disposed between the lowermost layer and the uppermost layer. However, the present disclosure is not limited thereto.

The first electrode 31 and the second electrode 32 are patterned and disposed between the insulating layers 10a, 10b, 10c, and 10d, and then, are fired together with the insulating layers 10a, 10b, 10c, and 10d.

The first electrode 31 is exposed on the third insulating layer 10c, and is connected to a metal pattern disposed on the second insulating layer 10b through a via passing through the third insulating layer 10c, so that the first electrode 31 can be connected along a side surface of the body 10 to a first pad 31a disposed on the bottom surface of the body 10.

The second electrode 32 extends on the first insulating layer 10a exposed through the second insulating layer 10b, and is connected along a side surface of the body 10 to a second pad 32a disposed on the bottom surface of the body 10.

Electric current is applied to the first and second electrodes 31 and 32 through the first and second pads 31a and 32a. The configuration of the first and second electrodes 31 and 32 is not limited thereto, provided that they are separated from each other between the insulating layers 10a, 10b, 10c, and 10d.

Referring to FIG. 2, a dummy electrode 33 may be disposed on the third insulating layer 10c to electrically connect to the second electrode 32. The dummy electrode 33 may be electrically connected to a device other than the light emitting diode 20.

The second electrode 32 is disposed on an exposed portion of the first insulating layer 10a, that is, on the bottom of the cavity 15, and thus, functions as a mounting pad on which the light emitting diode 20 is mounted.

The first electrode 31 may be electrically connected to the top surface of the light emitting diode 20 through a wire 22.

A cathode mark (not shown) may be formed on the body 10 to discriminate the first and second electrodes 31 and 32 from each other, but the present invention is not limited thereto.

A reflective layer (not shown) may be disposed over the first and second electrodes 31 and 32 on the top surface of the body 10.

The light emitting diode 20 may be mounted on the body 10 within the cavity 15.

At least one light emitting diode 20 may be mounted on the body 10 according to a design of the light emitting device package 100. When the light emitting device package 100 is provided in plurality, a plurality of electrodes for supplying power to the light emitting device packages 100, and a plurality of reflective layers may be provided, but the present disclosure is not limited thereto.

The light emitting diode 20 may be directly mounted on the insulating layer 10a, 10b, 10c, or 10d, or be electrically adhered to the first or second electrode 31 or 32.

The light emitting diode 20 may be an ultraviolet light emitting diode having a wavelength ranging from about 245 nm to 405 nm. That is, the light emitting diode 20 may emit an ultraviolet ray having a short wavelength of about 280 nm, or an ultraviolet ray having a long wavelength of about 365 nm or 385 nm.

The light emitting diode 20 may be mounted using a wire bonding method, a die bonding method, or a flip bonding method, which may be selected according to the type of a chip and the position of an electrode of the chip.

The light emitting diode 20 may include a group III-V compound semiconductor such as AlInGaN, InGaN, GaN, GaAs, InGaP, AlInGaP, InP, and InGaAs.

The light emitting diode 20 may be adhered to the second electrode 32 through a conductive adhesive, and be electrically connected to the first electrode 31 through the wire 22.

The light emitting diode 20 is called a vertical light emitting device, and includes, as illustrated in FIG. 3, a conductive support substrate 21, a bonding layer 23, a second conductive type semiconductor layer 25, an active layer 27, and a first conductive type semiconductor layer 29.

The conductive support substrate 21 may include a metal or an electrically conductive semiconductor substrate.

A group III-V nitride semiconductor layer is disposed on the conductive support substrate 21. In this case, an electron beam evaporator, a physical vapor deposition (PVD) apparatus, a chemical vapor deposition (CVD) apparatus, a plasma laser deposition (PLD) apparatus, a sputtering apparatus including a dual-type thermal evaporator, or a metal organic chemical vapor deposition (MOCVD) apparatus may be used as a semiconductor growing apparatus, but the present disclosure is not limited thereto.

The bonding layer 23 may be disposed on the conductive support member 21. The bonding layer 23 adheres the conductive support substrate 21 to the group III-V nitride semiconductor layer. The conductive support substrate 21 may be formed using a plating method instead of a bonding method. In this case, the bonding layer 23 may be removed.

The second conductive type semiconductor layer 25 is disposed on the bonding layer 23, and is electrically connected to the second electrode 32 through the bonding layer 23 and the conductive support substrate 21.

The second conductive type semiconductor layer 25 may be formed of a group III-V compound semiconductor, e.g., at least one of GaN, InN, AlN, InGaN, AlGaN, InAlGaN, and AlInN. The second conductive type semiconductor layer 25 may be doped with a second conductive type dopant that includes Mg, Zn, Ca, Sr, or Ba as a P type dopant.

For example, the second conductive type semiconductor layer 25 may be formed as a p type GaN layer having a certain thickness by supplying gas including $NH_3$, TMGa (or TEGa), and a p type dopant such as Mg.

The second conductive type semiconductor layer 25 has a current spreading structure in a certain region. The current spreading structure includes semiconductor layers in which a horizontal current spreading speed is higher than a vertical current spreading speed.

For example, the current spreading structure may include semiconductor layers that are different in dopant concentration or conductivity.

The second conductive type semiconductor layer 25 may uniformly diffuse carriers into a layer disposed thereon, e.g., into the active layer 27.

The active layer 27 is disposed on the second conductive type semiconductor layer 25. The active layer 27 may have a single quantum well structure or a multi quantum well (MQW) structure. The active layer 27 may selectively include a period of InGaN/GaN, a period of AlGaN/InGaN, a period InGaN/InGaN, and a period of AlGaN/GaN.

A second conductive type clad layer (not shown) may be disposed between the second conductive type semiconductor layer 25 and the active layer 27. The second conductive type clad layer may be formed of a p type GaN-based semiconductor. The second conductive type clad layer may be formed of a material having a band gap higher than that of a well layer.

The first conductive type semiconductor layer 29 is disposed on the active layer 27. The first conductive type semiconductor layer 29 may be an n type semiconductor layer doped with a first conductive type dopant. The n type semiconductor layer may be formed of a compound semiconductor such as GaN, InN, AlN, InGaN, AlGaN, InAlGaN, or AlInN. The first conductive type dopant as an n type dopant may include at least one of Si, Ge, Sn, Se, and Te.

For example, the first conductive type semiconductor layer 29 may be formed as an n type GaN layer having a certain thickness by supplying gas including $NH_3$, TMGa (or TEGa), and an n type dopant such as Si.

The second conductive type semiconductor layer 25 may be formed as a p type semiconductor layer, and the first conductive type semiconductor layer 29 may include an n type semiconductor layer. A light emitting structure may have one of an n-p junction structure, a p-n junction structure, an n-p-n junction structure, and a p-n-p junction structure. Hereinafter, the first conductive type semiconductor layer 29 is exemplified as the uppermost layer of a semiconductor layer.

At least one of a first electrode and an electrode layer (not shown) may be disposed on the first conductive type semiconductor layer 29. The electrode layer may include an oxide or nitride-based light transmitting layer, for example, be formed of a material selected from ITO (indium tin oxide), ITON (indium tin oxide nitride), IZO (indium zinc oxide), IZON (indium zinc oxide nitride), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), $IrO_x$, $RuO_x$, and NiO. The electrode layer may function as a current spreading layer for spreading current.

The electrode layer may be a reflective electrode layer that may be formed of a material selected from Ag, Ni, Al, Rh, Pd, Ir, Ru, Mg, Zn, Pt, Au, Hf, and a combination thereof. The first electrode may include a metal layer having a single or multi-layered structure. For example, the metal layer may be formed of at least one of Ag, Ni, Al, Rh, Pd, Ir, Ru, Mg, Zn, Pt, Au, Hf, and an alloy thereof.

A plurality of the light emitting diodes 20 may be mounted on the body 10.

The light emitting diode 20 may be mounted on the second electrode 32 and be electrically connected thereto, and be electrically connected to the first electrode 31 through the wire 22.

For example, an end of the wire 22 may be bonded to the first electrode 31, and the other end thereof may be bonded to the light emitting diode 20, but the present disclosure is not limited thereto.

The cavity 15 may be filled with inert gas, instead of a sealing material. That is, the cavity 15 may be filled with inert gas such as nitrogen to protect the light emitting diode 20 from environmental conditions such as moisture and oxygen.

The light transmitting film 80 as a hard glass film is disposed over the body 10 to cover the cavity 15.

The light transmitting film 80 may be formed of a transparent material such as LiF, $MgF_2$, $CaF_2$, $BaF_2$, $Al_2O_3$, $SiO_2$, and optical glass (N-BK7○R). Examples of $SiO_2$ may be quartz crystal and UV Fused Silica.

Furthermore, the light transmitting film 80 may be formed of low iron glass.

The support member 95 is disposed on the fourth insulating layer 10d as the uppermost layer of the body 10 to support the light transmitting film 80.

The support member 95 is disposed on the body 10 to form a certain space between the light transmitting film 80 and a portion of the cavity 15 corresponding to the body 10.

The support member 95 and the fourth insulating layer 10d may be integrally formed of the same material. Alternatively, the support member 95 may be formed of a material, such as a metal, different from that of the fourth insulating layer 10d, and be attached thereto.

The support member 95 may be a ring type or a frame type support member disposed on the fourth insulating layer 10d to surround an open region of the fourth insulating layer 10d.

The light transmitting film 80 may be attached to the top surface of the support member 95 through an adhesive, without using laser or soldering, thereby simplifying the manufacturing process thereof and reducing costs.

Figure 5:
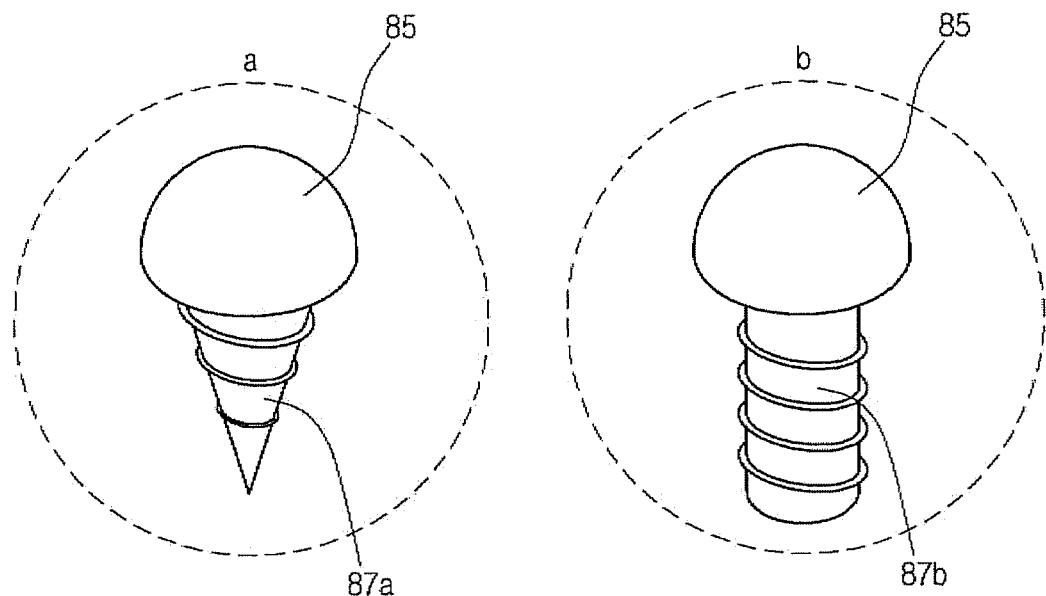
FIGS. 5A and 5B are perspective views illustrating examples of a portion defined by a dotted circle of FIG. 4.

Hereinafter, a method of attaching the light transmitting film 80 to the support member 95 according to the first embodiment will now be described with reference to FIGS. 4 and 5.

Referring to FIG. 4, the light emitting device package 100 includes coupling pins 91 passing through the top surface of the support member 95 and the light transmitting film 80.

In detail, support recesses 11 are disposed in the support member 95 to receive the coupling pins 91, and the light transmitting film 80 includes glass holes 81 aligned with the support recesses 11 to receive the coupling pins 91.

Referring to FIG. 4, the coupling pin 91 includes a pin head 85 and a pin body 87. A diameter of the pin head 85 is greater than a diameter of the pin body 87 that may have a conic shape that decreases in diameter in a direction away from the pin head 85.

The diameter of the pin head 85 is greater than a diameter of the glass hole 81, and the pin body 87 is fitted in the glass hole 81 and the support recess 11, thereby coupling the light transmitting film 80 to the support member 95.

Although the pin head 85 has a hemispheric shape as illustrated in FIG. 4, the pin head 85 may have a flat top surface, and have a circular or polygonal cross section.

Referring to FIG. 5A, a pin body 87a of the coupling pin 91 has a conic shape that decreases in diameter in the direction away from the pin head 85. A screw thread protrusion is formed on the surface of the conic shape, and a screw thread recess that is coupled to the screw thread protrusion is formed in the side surfaces of the support recess 11 and the glass hole 81, so that the coupling pin 91 can be screwed to the support recess 11 and the glass hole 81.

Referring to FIG. 5B, a pin body 87b of the coupling pin 91 may have a cylindrical shape that has a constant diameter to an end thereof from the pin head 85. A screw thread protrusion is formed on the surface of the cylindrical shape, and a screw thread recess that is coupled to the screw thread protrusion is formed in the side surfaces of the support recess 11 and the glass hole 81, so that the coupling pin 91 can be screwed to the support recess 11 and the glass hole 81.

As such, the shape of the coupling pins 91 may be varied, and the coupling pins 91 are coupled to the support member 95 through the light transmitting film 80 to thereby couple the light transmitting film 80 to the support member 95.

An adhesive (not shown) may be applied between the light transmitting film 80 and the top surface of the support member 95, and may be a Ag paste, a UV adhesive, Pb-free low temperature glass, an acrylic adhesive, or a ceramic adhesive.

The body 10 is formed of ceramic so as to dissipate heat due to a UV wavelength, without increasing the size of the light emitting device package 100. Accordingly, the light emitting device package 100 can have a constant package structure, regardless of a wavelength of light emitted from the light emitting diode 20, and thus, can be compatible with various light emitting diodes for emitting various beams of different wavelengths.

Hereinafter, a light emitting device package according to a second embodiment will now be described with reference to FIG. 6.

Figure 6:
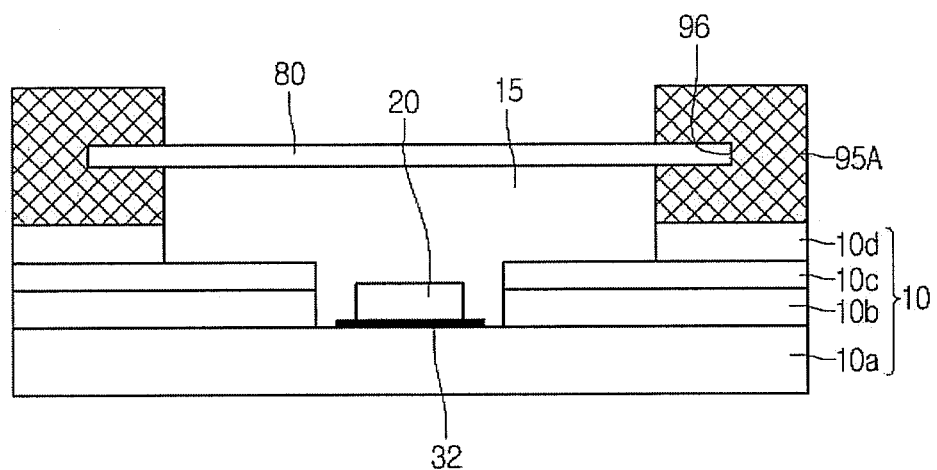
FIG. 6 is a cross-sectional view illustrating a light emitting device package according to a second embodiment.

Referring to FIG. 6, a light emitting device package 100A includes: a body 10 formed of ceramic; at least one light emitting diode 20 disposed on the body 10; and first and second electrodes (not shown) disposed on the body 10, and electrically connected to the light emitting diode 20.

Further, the light emitting device package 100A includes a light transmitting film 80 protecting the light emitting diode 20, and a support member 95A supporting the light transmitting film 80.

Since the body 10, insulating layers 10a, 10b, 10c, and 10d, the light emitting diode 20, and the electrodes of the light emitting device package 100A are similar in configuration to those of the light emitting device package 100 of FIGS. 1 to 3, a description thereof will be omitted.

Referring to FIG. 6, the support member 95A is provided with a glass recess 96 in which the light transmitting film 80 is slid.

The glass recess 96 is disposed in the side inner wall of the support member 95A adjacent to the body 10, and has a height equal to or greater than the thickness of the light transmitting film 80.

The light transmitting film 80 is laterally slid along the glass recess 96 to seal a cavity 15.

An adhesive (not shown) may be applied within the glass recess 96.

The adhesive may be a Ag paste, a UV adhesive, Pb-free low temperature glass, an acrylic adhesive, or a ceramic adhesive.

As such, the glass recess 96 is disposed in the side inner wall of the support member 95A, so that the light transmitting film 80 is slid and coupled to the support member 95A with the adhesive applied therebetween, thereby improving coupling force thereof.

Hereinafter, a light emitting device package according to a third embodiment will now be described with reference to FIG. 7.

Figure 7:
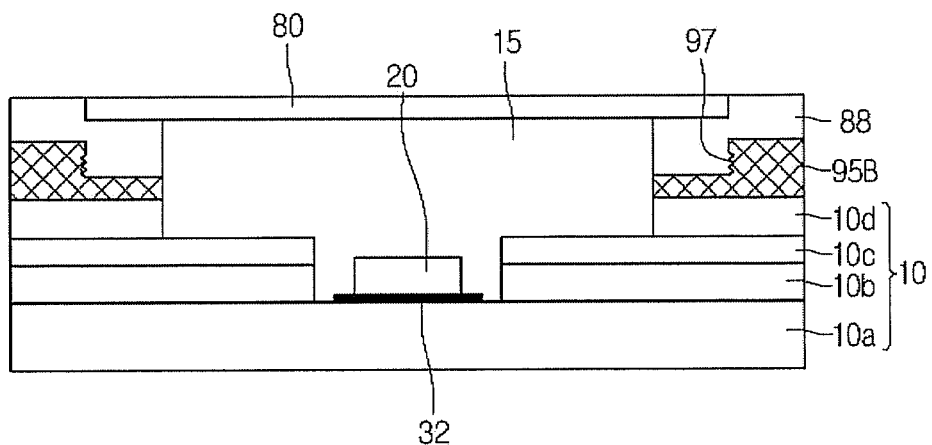
FIG. 7 is a cross-sectional view illustrating a light emitting device package according to a third embodiment.

Referring to FIG. 7, a light emitting device package 100B includes: a body 10 formed of ceramic; at least one light emitting diode 20 disposed on the body 10; and first and second electrodes (not shown) disposed on the body 10, and electrically connected to the light emitting diode 20.

Further, the light emitting device package 100B includes a light transmitting film 80 protecting the light emitting diode 20, and a support member 95B supporting the light transmitting film 80.

Since the body 10, insulating layers 10a, 10b, 10c, and 10d, the light emitting diode 20, and the electrodes of the light emitting device package 100B are similar in configuration to those of the light emitting device package 100 of FIGS. 1 to 3, a description thereof will be omitted.

Referring to FIG. 7, the light emitting device package 100B further includes a glass case 88 coupled to the light transmitting film 80 and screwed to the support member 95B.

The glass case 88 includes an upper inner step structure on which the light transmitting film 80 is placed, and an lower outer step structure coupled to the support member 95B.

A screw thread recess that is screwed to the support member 95B is disposed in a side wall of the lower outer step structure.

The support member 95B includes an upper step structure coupled to the glass case 88, and a screw thread protrusion 97 is disposed on a side wall of the upper step structure to engage with the screw thread recess of the glass case 88.

The light transmitting film 80 may be coupled to the support member 95B by screwing the glass case 88, integrally formed with the light transmitting film 80, to the support member 95B.

The glass case 88 and the light transmitting film 80 may be integrally formed of the same material at the same time, or the glass case 88 may be a metal member coupled to the light transmitting film 80.

The light transmitting film 80 can be easily coupled to the light emitting device package 100B by just screwing the glass case 88, to which the light transmitting film 80 is attached, to the support member 95B.

Hereinafter, a light emitting device package according to a fourth embodiment will now be described with reference to FIG. 8.

Figure 8:
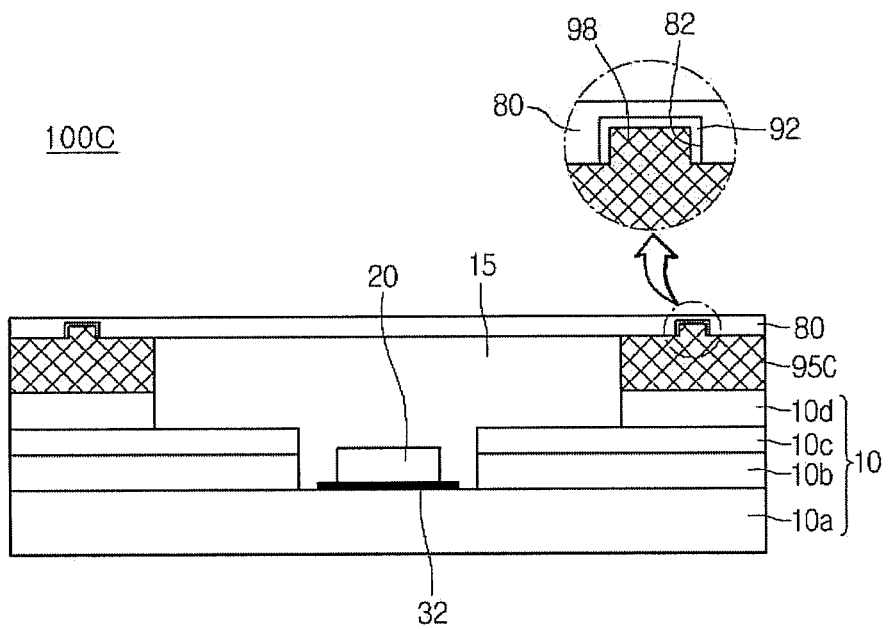
FIG. 8 is a cross-sectional view illustrating a light emitting device package according to a fourth embodiment.

Referring to FIG. 8, a light emitting device package 100C includes: a body 10 formed of ceramic; at least one light emitting diode 20 disposed on the body 10; and first and second electrodes (not shown) disposed on the body 10, and electrically connected to the light emitting diode 20.

Further, the light emitting device package 100C includes a light transmitting film 80 protecting the light emitting diode 20, and a support member 95C supporting the light transmitting film 80.

Since the body 10, insulating layers 10a, 10b, 10c, and 10d, the light emitting diode 20, and the electrodes of the light emitting device package 100C are similar in configuration to those of the light emitting device package 100 of FIGS. 1 to 3, a description thereof will be omitted.

Referring to FIG. 8, the light emitting device package 100C further includes a plurality of coupling protrusions 98 protruding from the top surface of the support member 95C, and a plurality of coupling recesses 82 disposed in the light transmitting film 80. The coupling recesses 82 are aligned with the coupling protrusions 98, and receive the coupling protrusions 98.

The coupling protrusions 98 may be formed of the same material as that of the support member 95C.

The coupling protrusions 98 are caught in the coupling recesses 82, so that the light transmitting film 80 can seal a cavity 15. An adhesive 92 is applied between the light transmitting film 80 and the top surface of the support member 95C.

The adhesive 92 may be a Ag paste, a UV adhesive, Pb-free low temperature glass, an acrylic adhesive, or a ceramic adhesive.

As such, the light transmitting film 80 is caught by the support member 95C with the adhesive 92 applied therebetween, thereby improving coupling force thereof.

Hereinafter, a light emitting device package according to a fifth embodiment will now be described with reference to FIG. 9.

Figure 9:
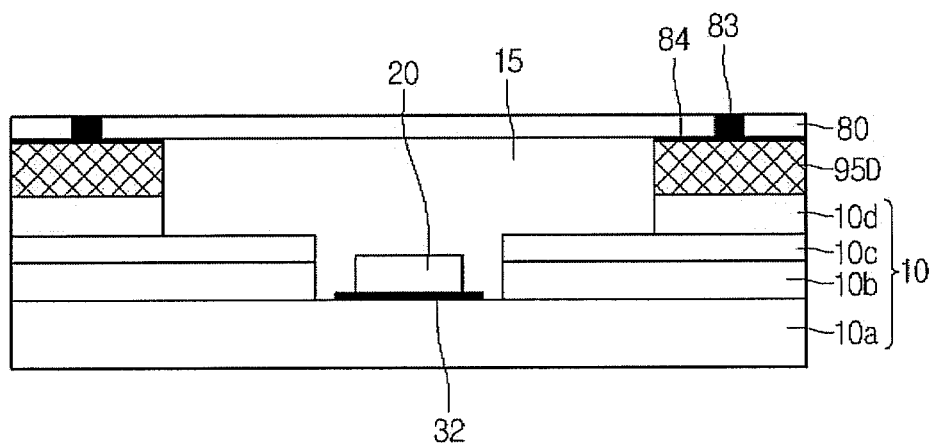
FIG. 9 is a cross-sectional view illustrating a light emitting device package according to a fifth embodiment.

Referring to FIG. 9, a light emitting device package 100D includes: a body 10 formed of ceramic; at least one light emitting diode 20 disposed on the body 10; and first and second electrodes (not shown) disposed on the body 10, and electrically connected to the light emitting diode 20.

Further, the light emitting device package 100D includes a light transmitting film 80 protecting the light emitting diode 20, and a support member 95D supporting the light transmitting film 80.

Since the body 10, insulating layers 10a, 10b, 10c, and 10d, the light emitting diode 20, and the electrodes of the light emitting device package 100D are similar in configuration to those of the light emitting device package 100 of FIGS. 1 to 3, a description thereof will be omitted.

Referring to FIG. 9, the light emitting device package 100D includes adhering holes 83 disposed in the light transmitting film 80 on the body 10, and formed in a region contacting the top surface of the support member 95D.

An adhesive 84 is applied between the light transmitting film 80 and the top surface of the support member 95D.

The adhesive 84 may be a Ag paste, a UV adhesive, Pb-free low temperature glass, an acrylic adhesive, or a ceramic adhesive. The adhesive 84 is applied, and then, the light transmitting film 80 and the support member 95D are pressed. Accordingly, the adhering holes 83 are filled with the adhesive 84, and then the adhesive 84 is cured.

Thus, the light transmitting film 80 is attached to the support member 95D with the adhesive 84 therebetween, and simultaneously, the adhering holes 83 are physically coupled to the adhesive 84, thereby improving coupling force of the light transmitting film 80 and the support member 95D.

Although the adhering holes 83 are disposed in the light transmitting film 80, adhering recesses that are filled with the adhesive 84 may be disposed therein, and thus, the present disclosure is not limited to the adhering holes 83.

Figure 10:
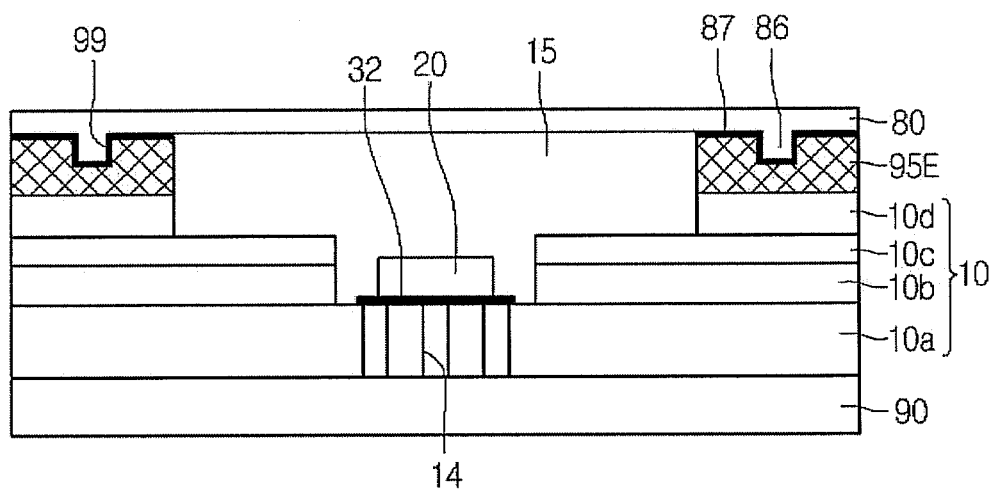
FIG. 10 is a cross-sectional view illustrating a light emitting device package according to a sixth embodiment.

FIG. 10 is a cross-sectional view illustrating a light emitting device package according to a sixth embodiment.

Referring to FIG. 10, a light emitting device package 100E includes: a body 10 formed of ceramic; at least one light emitting diode 20 disposed on the body 10; and first and second electrodes (not shown) disposed on the body 10, and electrically connected to the light emitting diode 20.

Further, the light emitting device package 100E includes a light transmitting film 80 protecting the light emitting diode 20, and a support member 95E supporting the light transmitting film 80.

Since the body 10, insulating layers 10a, 10b, 10c, and 10d, the light emitting diode 20, and the electrodes of the light emitting device package 100E are similar in configuration to those of the light emitting device package 100 of FIGS. 1 to 3, a description thereof will be omitted.

Referring to FIG. 10, the light emitting device package 100E includes heat dissipation holes 14 within the body 10 under a cavity 15 to transfer heat from the light emitting diode 20 to a heat dissipation member 90.

The heat dissipation holes 14 pass through the body 10 from the bottom of the cavity 15 to the heat dissipation member 90, and may be disposed under the light emitting diode 20.

The heat dissipation member 90 may be formed of a material having heat conductivity higher than that of the body 10. The heat dissipation holes 14 are formed by punching holes in the ceramic constituting the first insulating layer 10a before firing the first insulating layer 10a.

Although heat can be transferred through the spaces within the heat dissipation holes 14 by convection, the heat dissipation holes 14 may be filled with a material having heat conductivity higher than that of the body 10.

The light transmitting film 80 may be adhered to the support member 95E according to one of the embodiments of FIGS. 4 to 9. Alternatively, as illustrated in FIG. 10, glass protrusions 86 may be disposed on the light transmitting film 80, and recesses 99 aligned with the glass protrusions 86 may be disposed on the top surface of the support member 95E, so that the light transmitting film 80 can be adhered to the support member 95E with the glass protrusions 86 being fitted in the recesses 99.

In this case, an adhesive 87 may be applied between the light transmitting film 80 and the top surface of the support member 95E, thereby improving coupling force of the light transmitting film 80 and the support member 95E.

Figure 11:
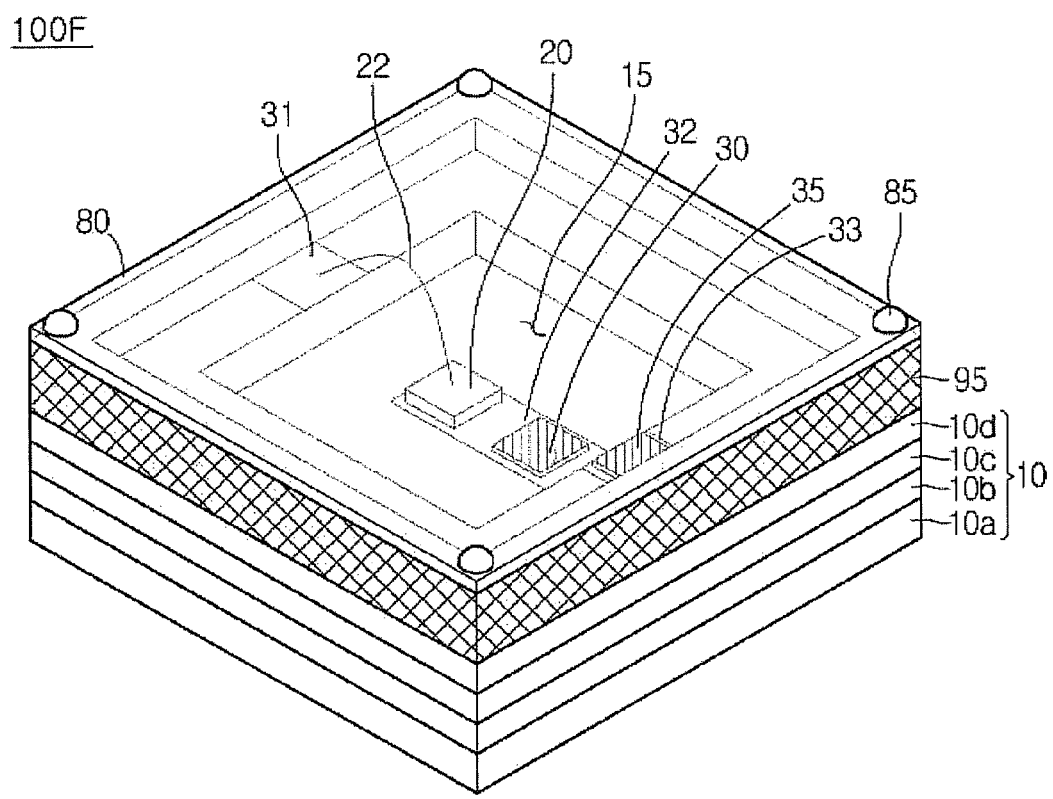
FIG. 11 is a perspective view illustrating a light emitting device package according to a seventh embodiment.

FIG. 11 is a perspective view illustrating a light emitting device package according to a seventh embodiment.

Referring to FIG. 11, a light emitting device package 100F includes: a body 10 formed of ceramic; at least one light emitting diode 20 disposed on the body 10; and first and second electrodes 31 and 32 disposed on the body 10, and electrically connected to the light emitting diode 20.

Further, the light emitting device package 100F includes a light transmitting film 80 protecting the light emitting diode 20, and a support member 95 supporting the light transmitting film 80.

Since the body 10, insulating layers 10a, 10b, 10c, and 10d, the light emitting diode 20, and the electrodes 31 and 32 of the light emitting device package 100F are similar in configuration to those of the light emitting device package 100 of FIGS. 1 to 3, a description thereof will be omitted.

The light emitting diode 20 may be an ultraviolet light emitting diode having a wavelength ranging from about 245 nm to 405 nm. That is, the light emitting diode 20 may emit an ultraviolet ray having a short wavelength of about 280 nm, or an ultraviolet ray having a long wavelength of about 365 nm or 385 nm.

The light emitting diode 20 as an ultraviolet light emitting diode may be adhered to the second electrode 32 through a conductive adhesive, and be electrically connected to the first electrode 31 through a wire 22. The light emitting diode 20 may be mounted using a wire bonding method, a die bonding method, or a flip bonding method, which may be selected according to the type of a chip and the position of an electrode of the chip.

The light emitting device package 100F further includes a color light emitting diode 30 and a Zener diode 35 within a cavity 15, which are electrically connected to the light emitting diode 20.

The color light emitting diode 30 may be a blue, green, or red light emitting diode, and be mounted on the second electrode 32, together with the light emitting diode 20, so that the color light emitting diode 30 can be electrically connected to the second electrode 32. In addition, the color light emitting diode 30 may be connected to the first electrode 31 through a wire (not shown).

When the color light emitting diode 30 is connected in parallel to the light emitting diode 20, the color light emitting diode 30 and the light emitting diode 20 operate in the same manner. At this point, the color light emitting diode 30 emits color light, so that it can be perceived by a naked eye whether the light emitting diode 20 operates.

Alternatively, the color light emitting diode 30 may receive power from a separate electrode (not shown) to perform a pulse type light emitting operation in which light is emitted only at a start point when the light emitting diode 20 starts to operate.

Reverse current may be guided to the Zener diode 35 disposed within the cavity 15 to protect the light emitting diode 20. The Zener diode 35 is disposed on a dummy electrode 33, and may receive power from a separate terminal.

The color light emitting diode 30, the Zener diode 35, and the light emitting diode 20 may be disposed within the cavity 15. The light transmitting film 80 may be coupled to the body 10 according to one of the embodiments of FIGS. 4 to 10.

According to the embodiments, an ultraviolet light emitting device package includes a ceramic body to efficiently dissipate heat, and a glass film is directly attached to the ceramic body to decrease the number of components, thereby simplifying the manufacturing process thereof, and reducing the manufacturing costs thereof.

The ceramic body is coupled to the glass film through an adhesive and a screw member, without using laser or soldering, thereby improving assembly efficiency.

In addition, the ultraviolet light emitting device package can be compatible with various light emitting diodes for emitting ultraviolet rays of a wavelength ranging from about 245 nm to 405 nm.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An ultraviolet light emitting device package comprising:
   a body comprising ceramic insulating layers defining a cavity having a bottom;
   an ultraviolet light emitting diode disposed within the cavity;
   a first electrode and a second electrode, which are spaced apart from each other on the body, and are electrically connected to the ultraviolet light emitting diode;
   a support member disposed on the body, and surrounding the cavity; and
   a glass film coupled to the support member, and covering the cavity,
   wherein the first electrode being disposed on one of the ceramic insulating layers and the second electrode being disposed on an other of the ceramic insulating layers, and
   wherein the ceramic insulating layers comprise;
   a first insulating layer exposed on the bottom of the cavity;
   a second insulating layer disposed on the first insulating layer; and
   a third insulating layer exposing a portion of the second insulating layer,
   wherein the first electrode is exposed on the second insulating layer, the second electrode is exposed on the first insulating layer and the second insulating layer.

2. The ultraviolet light emitting device package according to claim 1, wherein the cavity has a side step structure,
   the first electrode is exposed to the side step structure of the cavity, and
   the second electrode is exposed to a bottom of the cavity.

3. The ultraviolet light emitting device package according to claim 2, wherein the first and second electrodes are connected to a pad surrounding an outer surface of the body, and disposed on a bottom surface of the body.

4. The ultraviolet light emitting device package according to claim 3, wherein the first and second electrodes have a multi-layered structure.

5. The ultraviolet light emitting device package according to claim 4, wherein the first and second electrodes are alternately formed with the ceramic insulating layers.

6. The ultraviolet light emitting device package according to claim 5, wherein the support member comprises at least one coupling protrusion on a top surface thereof, and
   the glass film comprises at least one coupling recess in which the coupling protrusion is fitted.

7. The ultraviolet light emitting device package according to claim 5, wherein the support member comprises at least one coupling recess in a top surface thereof, and
   the glass film comprises at least one coupling protrusion is fitted in the coupling recess.

8. The ultraviolet light emitting device package according to claim 5, further comprising at least one fixing pin fixing the glass film and the support member.

9. The ultraviolet light emitting device package according to claim 8, wherein the fixing pin comprises:
   a pin head having a diameter greater than a diameter of a through hole of the glass film; and
   a pin body extending from the pin head, and fitted in the through hole.

10. The ultraviolet light emitting device package according to claim 9, wherein the pin body comprises a screw thread protrusion on an outer surface thereof.

11. The ultraviolet light emitting device package according to claim 5, wherein an adhesive member is disposed between a top surface of the support member and the glass film.

12. The ultraviolet light emitting device package according to claim 11, wherein the adhesive member comprises an ultraviolet adhesive.

13. The ultraviolet light emitting device package according to claim 12, wherein the glass film comprises at least one adhering hole filled with the adhesive member.

14. The ultraviolet light emitting device package according to claim 5, wherein the support member comprises a recess in an inner surface thereof, and the glass film is slid in the recess.

15. The ultraviolet light emitting device package according to claim 5, wherein the body comprises at least one heat dissipation hole extending from the bottom of the cavity to the bottom surface of the body.

16. The ultraviolet light emitting device package according to claim 1, wherein the support member is integrally formed with the body.

17. The ultraviolet light emitting device package according to claim 1, further comprising a color light emitting diode within the cavity of the body to display an operation of the ultraviolet light emitting diode.

18. The ultraviolet light emitting device package according to claim 5, further comprising a Zener diode within the cavity of the body, wherein an overcurrent flowing to the ultraviolet light emitting diode flows to the Zener diode.

19. The ultraviolet light emitting device package according to claim 18, further comprising a dummy electrode disposed on the body, and the Zener diode is connected to the dummy electrode.

* * * * *